US008979566B2

(12) United States Patent
Yeh

(10) Patent No.: US 8,979,566 B2
(45) Date of Patent: Mar. 17, 2015

(54) ELECTRICAL CONNECTOR AND CARRIER THEREOF FOR ASSEMBLING IC PACKAGE

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 176 days.

(21) Appl. No.: 13/854,006

(22) Filed: Mar. 29, 2013

(65) Prior Publication Data

US 2014/0011377 A1 Jan. 9, 2014

(30) Foreign Application Priority Data

Jul. 9, 2012 (TW) .............................. 101124561 A

(51) Int. Cl.
*H01R 13/62* (2006.01)
*H01R 12/52* (2011.01)
*H01R 43/00* (2006.01)
*H01R 13/629* (2006.01)
*H01R 12/88* (2011.01)
*H05K 7/10* (2006.01)
*H05K 7/12* (2006.01)

(52) U.S. Cl.
CPC ................ *H01R 12/52* (2013.01); *H01R 43/00* (2013.01); *H01R 13/62933* (2013.01); *H01R 12/88* (2013.01); *H05K 7/1061* (2013.01); *H05K 7/12* (2013.01)
USPC ....................................................... 439/331

(58) Field of Classification Search
USPC .................................................. 439/73, 331
See application file for complete search history.

(56) References Cited

U.S. PATENT DOCUMENTS

| 4,502,747 | A  | * | 3/1985  | Bright et al. | 439/296 |
| 7,083,456 | B2 | * | 8/2006  | Trout et al.  | 439/326 |
| 7,677,912 | B2 |   | 3/2010  | Zhang         |         |
| 8,439,693 | B2 | * | 5/2013  | Yeh et al.    | 439/135 |
| 8,506,316 | B2 | * | 8/2013  | Tsai et al.   | 439/331 |
| 8,834,191 | B2 | * | 9/2014  | Yeh et al.    | 439/331 |
| 2005/0287858 | A1 | * | 12/2005 | Toda et al.  | 439/331 |
| 2007/0212917 | A1 | * | 9/2007  | Toda et al.  | 439/266 |
| 2007/0259543 | A1 | * | 11/2007 | Hsieh        | 439/73  |
| 2013/0344713 | A1 |   | 12/2013 | Yeh          |         |

FOREIGN PATENT DOCUMENTS

| CN | 202178462 U | 3/2012  |
| TW | 201036262   | 10/2010 |
| TW | I342641     | 5/2011  |

* cited by examiner

*Primary Examiner* — Neil Abrams
*Assistant Examiner* — Travis Chambers
(74) *Attorney, Agent, or Firm* — Wei Te Chung; Ming Chieh Chang

(57) ABSTRACT

An electrical connector (100) for electrically connecting an IC package with a substrate and includes an insulative housing (1) with a plurality of contacts (10) received therein, a stiffener (3) located outside of the insulative housing (1) and includes a front end (20) and a rear end (21) opposite to the front end (20), a holding member (61) pivotally assembled to the front end (20) of the stiffener (2), a carrier (8) assembled to the holding member (61) for holding the IC package (9), a load plate (3) pivotally assembled to the rear end (21) of the stiffener (2) and includes an opening (310) to permit the exposing of the IC package (9), the load plate (3) presses on the holding member (61).

20 Claims, 8 Drawing Sheets

ELECTRICAL CONNECTOR AND CARRIER THEREOF FOR ASSEMBLING IC PACKAGE

BACKGROUND OF THE INVENTION

1. Field of the Invention

The present invention relates to an electrical connector and carrier thereof for assembling IC package, and more particularly to an electrical connector using a carrier to hold and assemble the IC package to the electrical connector.

2. Description of Related Art

Chinese patent No. 202178462U issued to Cai on Mar. 28, 2012 discloses a conventional electrical connector for electrically connecting an IC package with a substrate. The electrical connector includes an insulative housing, a plurality of contacts received in the insulative housing, a frame located around the insulative housing, a load plate and a lever assembled to the frame, and a carrier assembled to the load plate. The load plate includes a plurality of holes. The carrier includes a plurality of protruding members positioned in the corresponding hole to position the carrier on the load plate. If to assemble the IC package to the electrical connector, paste the IC package to the carrier and position the carrier on the load plate, thus the IC package is assembled to the electrical connector by rotating the load plate to the closed position. Due to assemble the protruding members to the holes to position the carrier on the load plate, it is hard to assemble and the carrier is not stable on the load plate.

Hence, it is desirable to provide an improved electrical connector to overcome the aforementioned disadvantages.

SUMMARY OF THE INVENTION

Accordingly, an object of the present invention is to provide an electrical connector using a carrier to hold and assemble the IC package, at the same time, the carrier is easy assembled and positioned on the electrical connector stably.

According to one aspect of the present invention, an electrical connector for electrically connecting an IC package with a substrate and includes an insulative housing with a plurality of contacts received therein, a stiffener located outside of the insulative housing and includes a front end and a rear end opposite to the front end, a holding member pivotally assembled to the front end of the stiffener, a carrier assembled to the holding member for holding the IC package, a load plate pivotally assembled to the rear end of the stiffener and includes an opening to permit the exposing of the IC package, the load plate presses on the holding member.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
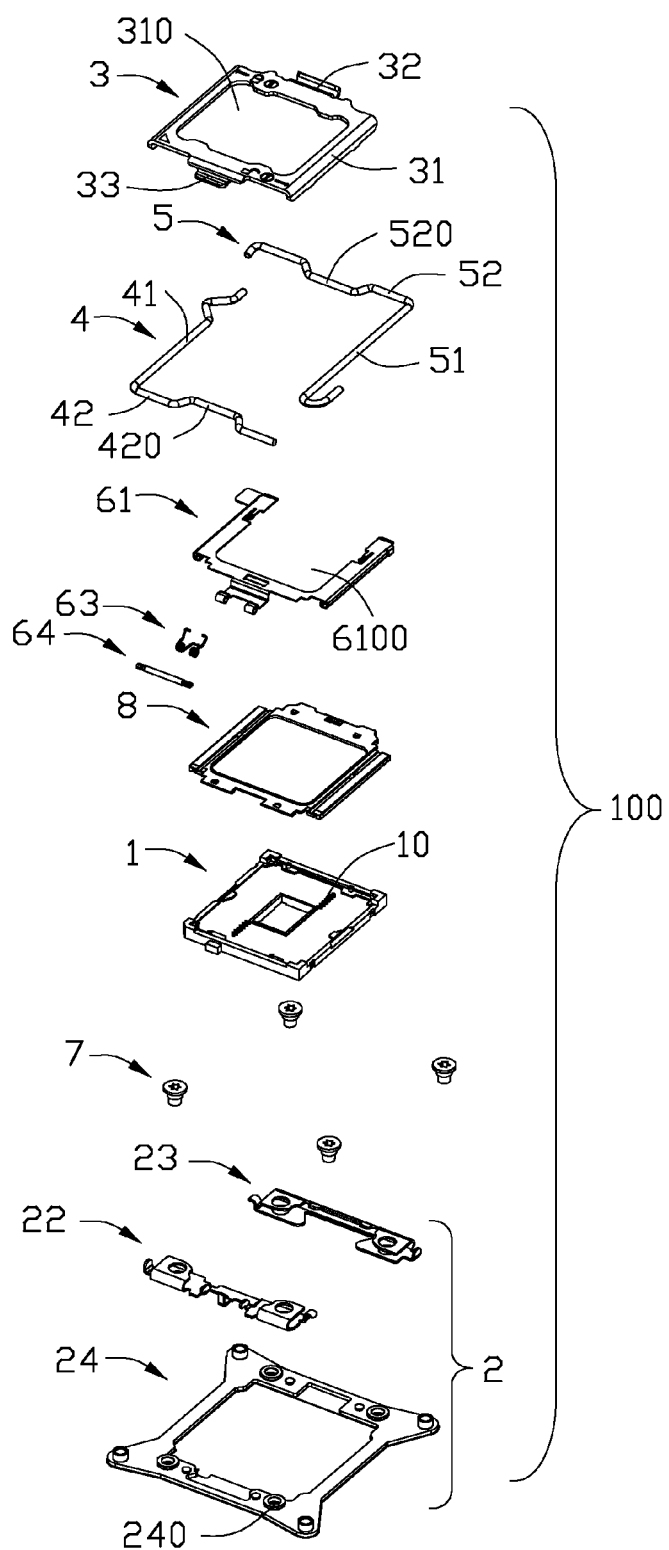
FIG. 1 is an exploded view of an electrical connector according to a preferred embodiment of the present invention.
Figure 7:
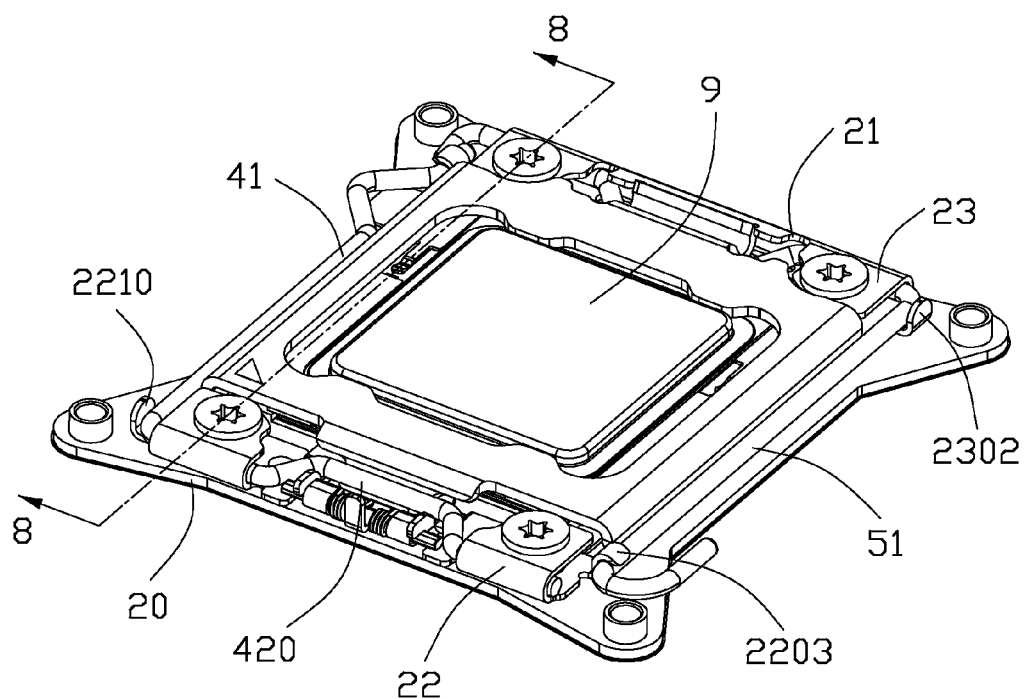
FIG. 7 is similar to FIG. 6, wherein the holding member together with the carrier and the load plate both in a closed position.
Figure 8:
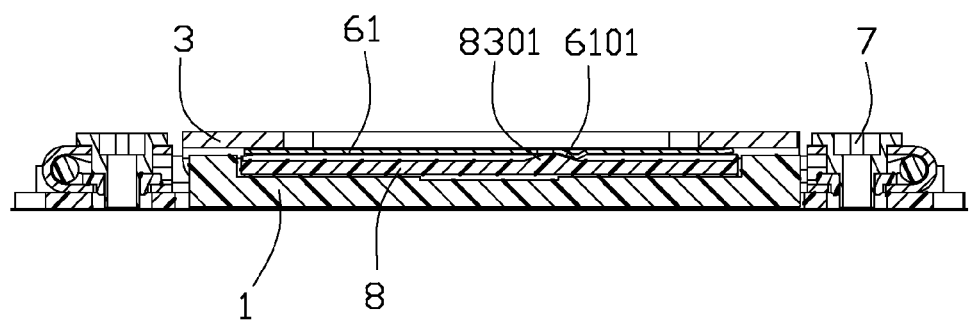
FIG. 8 is a cross-sectional view of the electrical connector taken along line 8-8 in FIG. 7.

FIGS. 1 and 7 illustrates an electrical connector 100 in accordance to a preferred embodiment of the present invention, the electrical connector 100 is used for electrically connecting an IC package 9 with a substrate (not labeled). The electrical connector 100 comprises an insulative housing 1, a plurality of contacts 10 received in the insulative housing 1, a stiffener 2 locates outside the insulative housing 1, a first lever 4 and a second lever 5 assembled to opposite ends of the stiffener 2, a load plate 3 and a holding member 61 assembled to the stiffener 2 and a carrier 8 assembled to the holding member 61. The carrier 8 moves with the holding member 61 to position the IC package 9 to the insulative housing 1.

Figure 2:
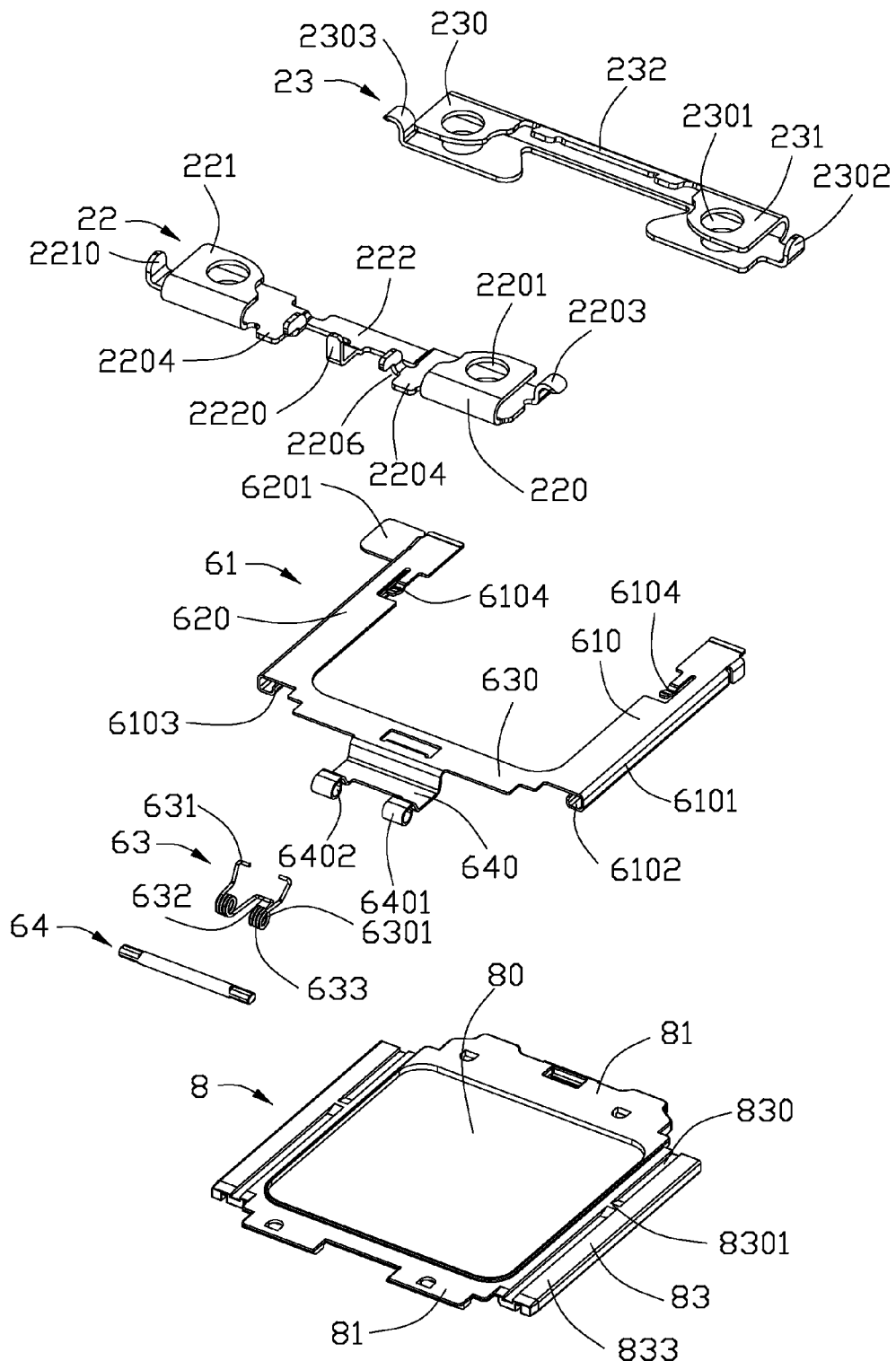
FIG. 2 is an exploded view of part members of the electrical connector as shown in FIG. 1.
Figure 3:
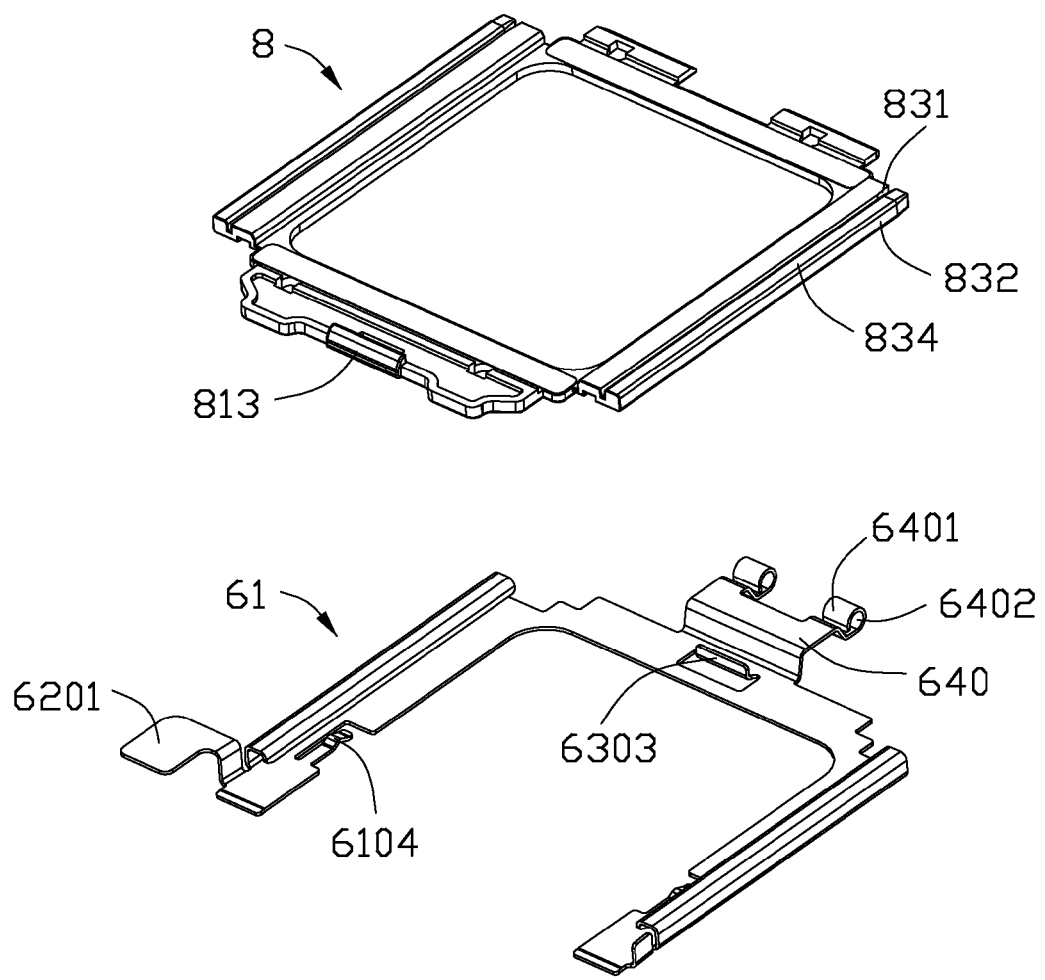
FIG. 3 is an exploded view of the holding member and the carrier.

Referring to FIGS. 2-3, the stiffener 2 comprises a front end 20 and a rear end 21 opposite to the front end 20. The holding member 61 and the first lever 4 are assembled to the front end 20, and the load plate 3 and the second lever 5 are assembled to the rear end 21. The stiffener 2 comprises a frame 24 located around the insulative housing 1, a first retention member 22 and a second retention member 23 assembled to the opposite ends of the frame 24. The frame 24 includes a plurality of retention holes 240.

The first retention member 22 comprises a first part 220, a second part 221 and a first connection portion 222 connecting the first part 220 and the second part 221. The first part 220 comprises a first interlock portion 2203 extending downwardly used for interlocking with the second lever 5. The second part 221 comprises a first resist portion 2210 extending upwardly to prevent the horizontal movement of the first lever 4. The first part 220 and the second part 221 both comprises a plurality of position holes 2201 corresponding to the retention holes 240 of the frame 24. The first part 220 and the second part 221 both includes a first restrict portion 2204 with U shape. The first restrict portion 2204 includes a receiving opening 2206. The first connection portion 222 includes a second restrict portion 2220 with L shape.

The second retention member 23 comprises a third part 230, a fourth part 231 and a second connection portion 232 connecting the third part 230 and the fourth part 231. The third retention member 230 comprises a second interlock portion 2303 extending downwardly used for interlocking with the first lever 4. The fourth part 231 comprises a second resist portion 2302 extending upwardly to prevent the horizontal movement of the second lever 5. The third part 230 and the fourth part 231 both comprises a plurality of position holes 2301 corresponding to the retention holes 240 of the frame 24.

Referring to FIG. 1 and FIG. 7, the first lever 4 is assembled to the first retention member 22. The first lever 4 comprises a fix lever 42 and an operation lever 41 perpendicular to the fix lever 42. The fix lever 42 is fixed to the first part 220 and the second part 221. The fix lever 42 includes a press portion 420 in the middle thereof. The second lever 5 has a similar shape with the first lever 4 and is fixed to the second retention member 23. The second lever 5 comprises a fix part 52 and an operation part 51 perpendicular with the fix part 52. The fix part 52 is fixed to the third part 230 and the fourth part 231. The fix part 52 includes an interlock portion 520 in the middle thereof.

In this embodiment, the load plate 3 is made of metal material and comprises a main portion 31 with a frame shape, a first tongue portion 32 and a second tongue portion 33 extending from opposite ends of the main portion 31. The main portion 31 includes an opening 310 to permit the exposing of the IC package 9. The first tongue portion 32 is interlocked with the interlock part 520 of the second lever 5. The press portion 420 of the first lever 4 pressed on the second tongue portion 33.

Referring to FIGS. 2-3, the holding member 61 is configured to U shape and comprises a first end 610, a second end 620 opposite to the first end 610 and a third end 630 connecting the first end 610 and the second end 620. The first end 610, the second end 620 and the third end 630 form a window 6100 to permit the exposing of the IC package 9. Each of the first end 610 and the second end 620 includes a spring tab 6104 and a retention portion 6101 extending downwardly. The spring tab 6104 locates above the retention portion 6101. The retention portion 6101 is configured to U shape and includes a sliding portion 6103 facing to the first end 610 or the second end 620 and disconnected with the first end 610 or the second end 620. The retention portion 6101 first extends downwardly and then extends horizontally and then extends upwardly to form a sliding channel 6102. The second end 620 includes a press portion 6201 extending outwardly. The third end 630 includes a bear portion 6303 extending curvedly and a fix portion 640 extending outwardly. The fix portion 640 includes a pair of fastening portions 6401. Each of the fastening portions 6401 defines a receiving hole 6402.

The electrical connector 100 also comprises a spring member 63 assembled to the front end 20 of the stiffener 2. The spring member 63 comprises a first resist portion 632, a pair of holding portions 633 extending from opposite ends of the first resist portion 632 and a pair of second resist portions 631 extending from the holding portion 633 respectively. Each of the holding portions 633 defines a hole 6301. The holding member 61 and the spring member 63 are assembled to the front end 20 of the stiffener 2 by a shaft 64.

The carrier 8 comprises a pair of first sides 81 and a pair of second sides 83 connecting the pair of first sides 81. The pair of first sides 81 and the pair of second sides 83 form a second opening 80 to permit exposing of the IC package 9. The first side 81 of the carrier 8 includes a handing portion 813. The second side 83 defines a top surface 833 and a bottom surface 834 opposite to the top surface 833. The carrier 8 comprises a groove 830 on the top surface 833 and a obstruct portion 8301 in the groove 830 and a sliding groove 831 on the bottom surface 834. The second side 83 also defines a sliding block 832 matched with the sliding channel 6102 of the holding member 61. The sliding block 832 locates on one side of the sliding groove 831.

Figure 4:
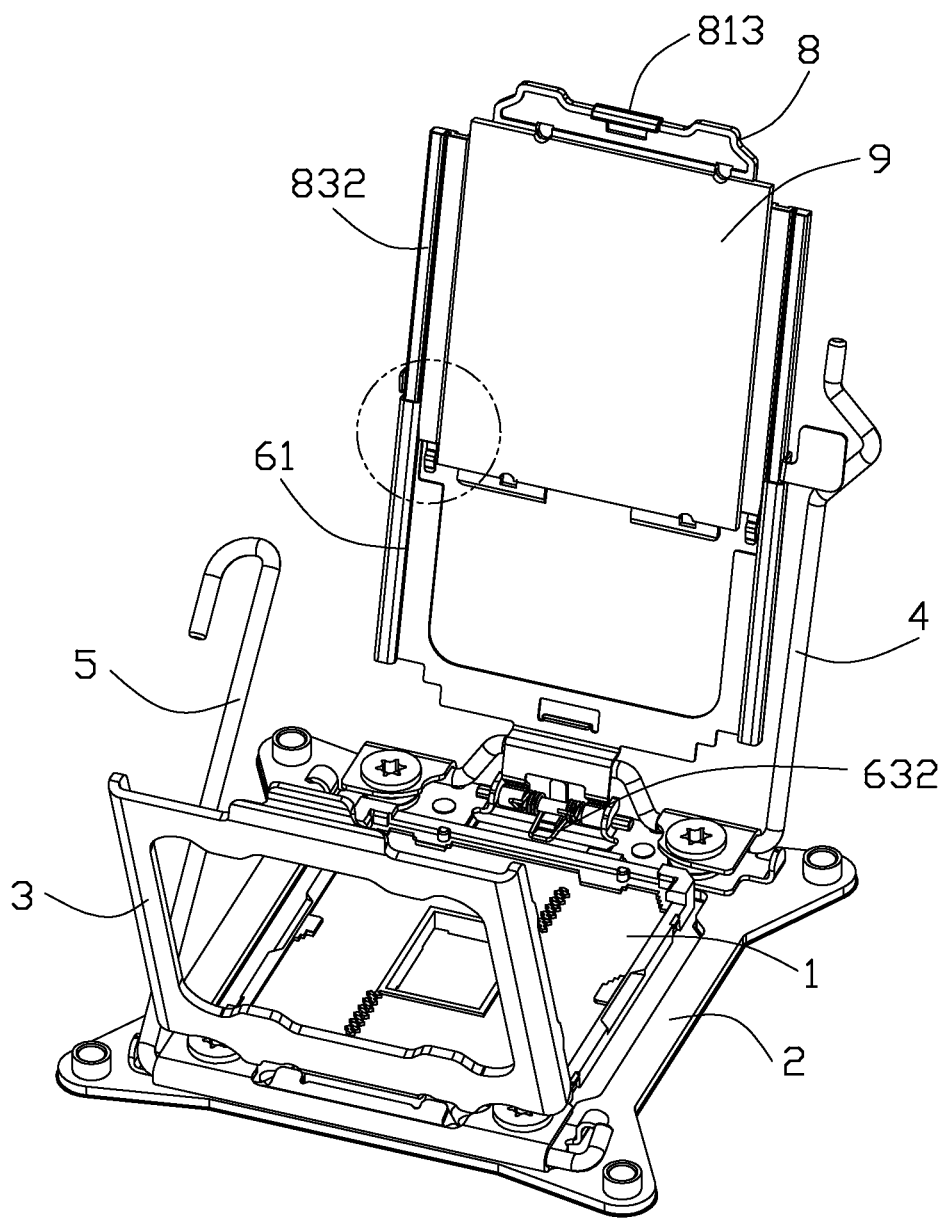
FIG. 4 is assembled view of the electrical connector as shown in FIG. 1, wherein the carrier together with an IC package not assembled to the holding member.
Figure 5:
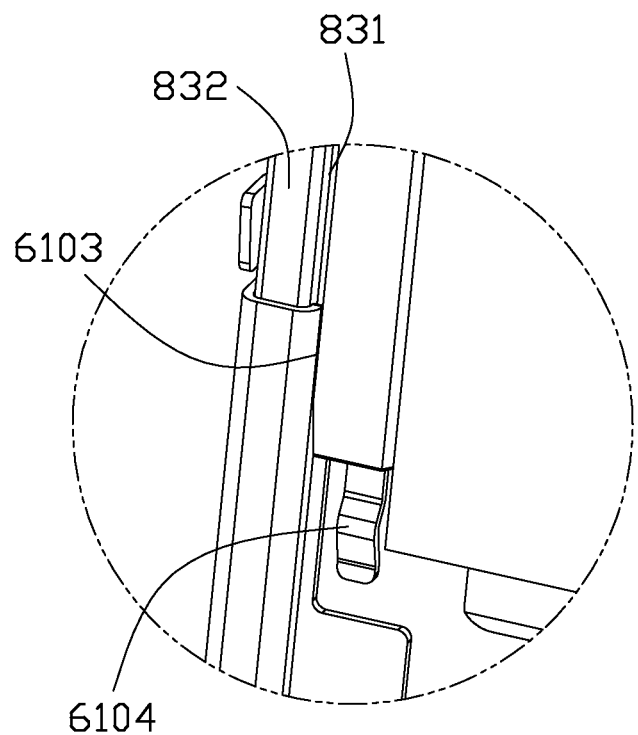
FIG. 5 is an enlarged view of the circular portion as shown in FIG. 4.
Figure 6:
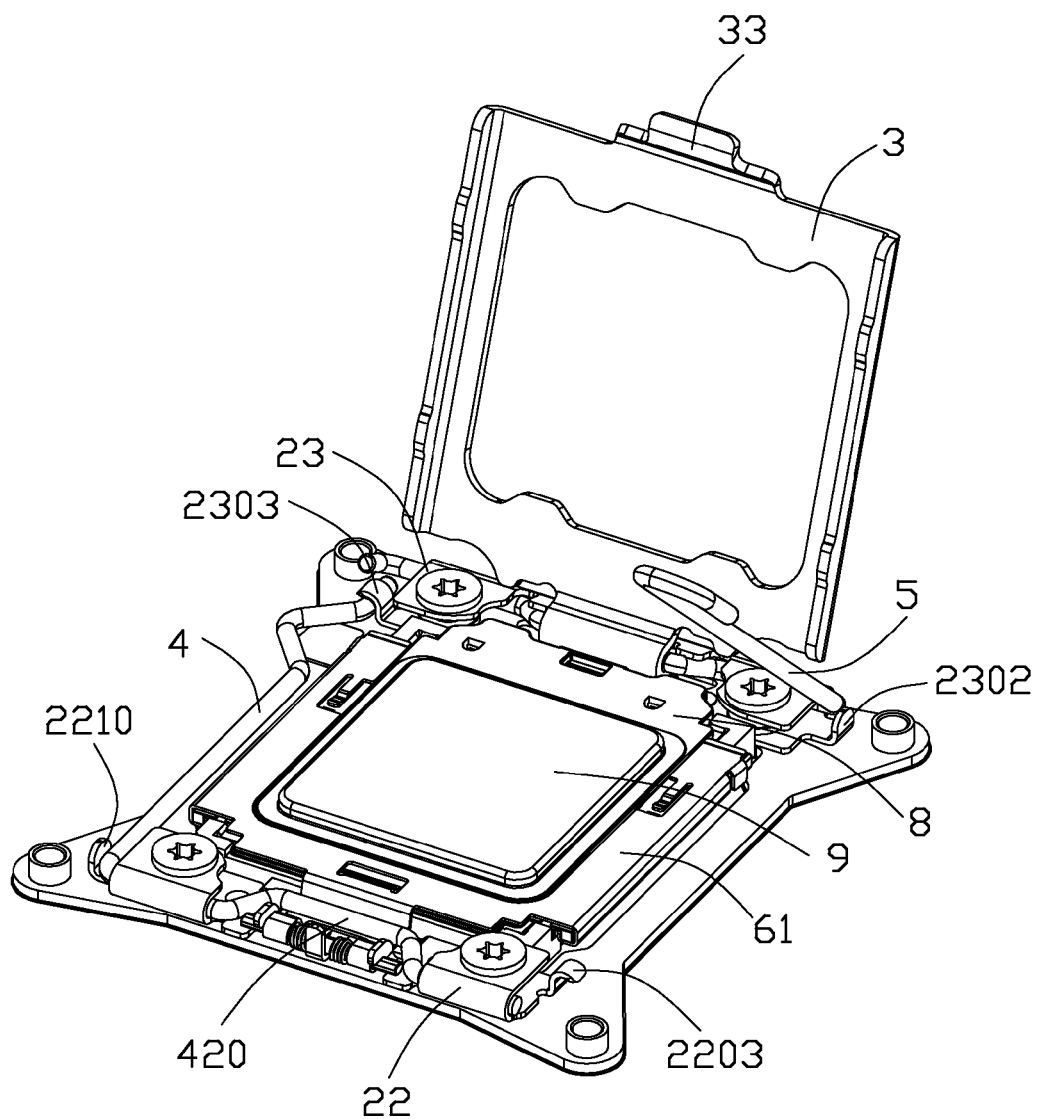
FIG. 6 is assembled view of the electrical connector as shown in FIG. 1, wherein the holding member together with the carrier is in a closed position and the load plate is in an opened position.

Referring to FIG. 4, When the electrical connector 100 is assembled, the shaft 64 goes through the receiving hole 6402 of the holding member 61 and the hole 6301 of the spring member 63. The two opposite ends of the shaft 64 are received in the receiving opening 2206 of the first restrict portion 2204 and the middle of the shaft 64 is restricted by the second restrict portion 2220 to prevent the shaft 64 breaking away from the first retention member 22. The screw 7 goes through the position holes 2201, 2301 of the first retention member 22 or the second retention member 23 and the retention holes 240 of the frame 24 to fix the first retention member 22 or the second retention member 23 on the frame 24. The first lever 4 is fixed to the first retention member 22. The second lever 5 is fixed to the second retention member 23. The first tongue portion 32 of the load plate 3 is fixed to the interlock portion 520 of the second lever 5. This is only one embodiment of this invention, not to limit this invention, for example the first retention member 22, the second retention member 23 and the frame 24 also can be set in a whole member, the holding member 61 is fixed to the frame 24.

Referring to FIGS. 4-8, when assembled the IC package 9 to the electrical connector 100, the IC package 9 is pasted on the carrier 8. The first lever 4, the second lever 5, the load plate 3 and the carrier 8 is rotated to an opened position. The sliding block 832 of the carrier 8 is put in the sliding channel 6102 of the holding member 61, the a sliding portion 6103 of the holding member 61 is put in the sliding groove 831 of the carrier 8, and the spring tab 6104 of the holding member 61 is put in the groove 830 of the carrier. Push the carrier 8 to make it slide along the holding member 61 until the carrier 8 touches the bear portion 6303 of the holding member 61. At the same time, the spring tab 6104 of the holding member 61 resist with the obstruct portion 8301 of the carrier 8 to prevent the carrier 8 breaking away from the holding member 61. Press the press portion 6201 of the holding member 61 to make it rotate to a closed position, and the IC package 9 is assembled to the insulative housing 1. Rotate the load plate 3, the first lever 4 and the second lever 5 to a closed position. The press portion 420 of the first lever 4 presses on the second tongue portion 33 of the load plate 3 to provide a force on the IC package 9, and a robust electrical connection is established between the IC package 9 and the substrate. When rotate the holding member 61 to a closed position, the fix portion 640 of the holding member 61 presses the second resist portions 631, and the first resist portion 632 presses the stiffener 2 to provide a force make the holding member 61 sprang open.

The electrical connector 100 includes a holding member 61, the carrier 8 slides along the holding member to make it be assembled to the holding member 61, it is easy to assemble the carrier 8.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an IC package with a substrate, comprising:
    an insulative housing;
    a plurality of contacts received in the insulative housing;
    a stiffener located outside of the insulative housing and comprising a front end and a rear end opposite to the front end;
    a holding member pivotally assembled to the front end of the stiffener;
    a carrier assembled to the holding member for holding the IC package; and
    a load plate pivotally assembled to the rear end of the stiffener and comprising an opening to permit the exposing of the IC package, the load plate pressed on the holding member.

2. The electrical connector as claimed in claim 1, wherein the holding member comprises a fix portion with a receiving hole, the electrical connector further includes a shaft goes through the receiving hole and fix the holding member to the stiffener.

3. The electrical connector as claimed in claim 1, wherein the holding member includes a sliding channel, the carrier includes a sliding block slide in the sliding channel.

4. The electrical connector as claimed in claim 3, wherein the holding member includes a retention portion first extends downwardly and then extends horizontally and then extends upwardly to form the sliding channel.

5. The electrical connector as claimed in claim 4, wherein the carrier includes a sliding groove, the retention portion includes a sliding portion slide in the sliding groove.

6. The electrical connector as claimed in claim 1, wherein the carrier comprises a groove and a obstruct portion in the groove, the holding member comprises a spring tab sliding in the groove and resist with the obstruct portion to prevent the breaking away of the carrier.

7. The electrical connector as claimed in claim 4, wherein the holding member includes a bear portion touched with carrier to prevent the downwardly movement of the carrier.

8. An electrical connector for electrically connecting an IC package with a substrate, comprising:
   an insulative housing;
   a plurality of contacts received in the insulative housing;
   a stiffener located outside of the insulative housing and comprising a front end and a rear end opposite to the front end;
   a holding member pivotally assembled to the front end of the stiffener to assemble the IC package to the insulative housing, the holding member comprising a first end, a second end opposite to the first end and a third end connecting the first end and the second, the first end the second end comprising a retention portion, the retention portion first extending in a vertical direction and then extending in a horizontal direction and then extending in a vertical direction to form a sliding channel; and
   a load plate pivotally assembled to the rear end of the stiffener and comprising an opening to permit the exposing of the IC package.

9. The electrical connector as claimed in claim 8, wherein the holding member comprises a fix portion with a receiving hole, the electrical connector further includes a shaft goes through the receiving hole and fix the holding member to the stiffener.

10. The electrical connector as claimed in claim 8, wherein electrical connector further comprises a carrier for holding the IC package, and the carrier includes a sliding block slide in the sliding channel.

11. The electrical connector as claimed in claim 10, wherein the carrier includes a sliding groove, the retention portion includes a sliding portion slide in the sliding groove.

12. The electrical connector as claimed in claim 8, wherein the carrier comprises a groove and a obstruct portion in the groove, the holding member comprises a spring tab sliding in the groove and resist with the obstruct portion to prevent the breaking away of the carrier.

13. The electrical connector as claimed in claim 12, wherein the holding member includes a bear portion touched with carrier to prevent the downwardly movement of the carrier.

14. An electrical connector assembly comprising:
   an insulative housing defining two opposite ends along a front-to-back direction, and an upward facing receiving cavity in communication with an exterior in a vertical direction perpendicular to said front-to-back direction;
   a plurality of contacts disposed in the housing with contacting sections upwardly extending into the receiving cavity;
   a holding member pivotally mounted around one of said two opposite ends;
   an electronic package mounted within the holding member and associatively moveable with said holding member in essentially a rotational manner with regard to the housing; and
   a load plate pivotally mounted around the other of said two opposite ends; wherein the load plate is positioned upon the holding member when the load plate is in a locked position.

15. The electrical connector assembly as claimed in claim 14, wherein said electronic package is assembled into the holding member via a carrier.

16. The electrical connector assembly as claimed in claim 14, wherein both said load plate and said holding member are retained in position by a lever which is pivotally mounted to said other of the two opposite ends.

17. The electrical connector assembly as claimed in claim 14, wherein said holding member is equipped with a spring to support said holding member in an upward oblique position when no retaining force is applied thereon.

18. The electrical connector assembly as claimed in claim 14, further including a lever pivotally mounted around said other of the two opposite ends to lock the load plate in the locked position.

19. The electrical connector assembly as claimed in claim 18, further including another lever pivotally mounted around said one of the two opposite ends and defining an offset type rotation shaft which said load plate is pivotally mounted upon.

20. The electrical connector assembly as claimed in claim 19, wherein said carrier is configured to be assembled to the holding member in a sliding manner.

* * * * *